(12) United States Patent
Hackler, Sr. et al.

(10) Patent No.: US 6,999,298 B2
(45) Date of Patent: Feb. 14, 2006

(54) MIM MULTILAYER CAPACITOR

(75) Inventors: Douglas R. Hackler, Sr., Boise, ID (US); Richard Alan Hayhurst, Nampa, ID (US); Michael Paul Goldston, Star, ID (US)

(73) Assignee: American Semiconductor, Inc., Boise, ID (US)

( * ) Notice: Subject to any disclaimer, the term of this patent is extended or adjusted under 35 U.S.C. 154(b) by 0 days.

(21) Appl. No.: 10/664,666

(22) Filed: Sep. 18, 2003

(65) Prior Publication Data

US 2005/0063140 A1 Mar. 24, 2005

(51) Int. Cl.
*H01G 4/005* (2006.01)
*H01G 4/20* (2006.01)

(52) U.S. Cl. .................. 361/303; 361/312; 257/303

(58) Field of Classification Search .............. 361/301.4, 361/303–305, 311–313, 301; 257/301, 303
See application file for complete search history.

(56) References Cited

U.S. PATENT DOCUMENTS

| | | | | |
|---|---|---|---|---|
| 5,005,102 A | * | 4/1991 | Larson | 361/313 |
| 5,130,267 A | * | 7/1992 | Kaya et al. | 438/396 |
| 5,150,276 A | * | 9/1992 | Gonzalez et al. | 361/313 |
| 5,160,987 A | | 11/1992 | Pricer et al. | 257/307 |
| 5,177,576 A | * | 1/1993 | Kimura et al. | 257/71 |
| 5,206,787 A | | 4/1993 | Fujioka | 257/307 |
| 5,213,992 A | * | 5/1993 | Lu | 438/398 |
| 5,227,322 A | * | 7/1993 | Ko et al. | 438/387 |
| 5,250,458 A | * | 10/1993 | Tsukamoto et al. | 438/244 |
| 5,258,321 A | * | 11/1993 | Shimizu et al. | 438/244 |
| 5,519,238 A | * | 5/1996 | Lu | 257/309 |
| 5,576,928 A | * | 11/1996 | Summerfelt et al. | 361/321.1 |
| 5,583,359 A | | 12/1996 | Ng et al. | 257/306 |
| 5,656,852 A | * | 8/1997 | Nishioka et al. | 257/632 |
| 5,912,485 A | | 6/1999 | Chao | 257/308 |
| 5,952,687 A | * | 9/1999 | Kawakubo et al. | 257/296 |
| 6,184,074 B1 | * | 2/2001 | Crenshaw et al. | 438/238 |
| 6,251,740 B1 | | 6/2001 | Johnson et al. | 438/381 |
| 6,320,244 B1 | * | 11/2001 | Alers et al. | 257/534 |
| 6,365,954 B1 | * | 4/2002 | Dasgupta | 257/532 |
| 6,410,955 B1 | | 6/2002 | Baker et al. | 257/307 |
| 6,417,535 B1 | | 7/2002 | Johnson et al. | 257/306 |
| 6,437,387 B1 | * | 8/2002 | Gutsche | 257/301 |
| 6,441,419 B1 | | 8/2002 | Johnson et al. | 257/296 |
| 6,465,832 B1 | | 10/2002 | Maeda et al. | 257/307 |
| 6,524,926 B1 | | 2/2003 | Allman et al. | 438/387 |

(Continued)

FOREIGN PATENT DOCUMENTS

JP 03091974 A 4/1991

OTHER PUBLICATIONS

Kim et al., "Development of CVD-Ru/Ta$_2$O$_5$/CVD-Ru Capacitor with Concave Structure for Multigigabit-scale DRAM Generation," 2001 IEEE, pp. 12.1.1-12.1.4.

(Continued)

*Primary Examiner*—Eric W. Thomas
(74) *Attorney, Agent, or Firm*—John R. Thompson; Stoel Rives LLP

(57) ABSTRACT

Disclosed is a high-performance, RF-capable MIM capacitor structure and process for the manufacture thereof, which are compatible with discrete or integrated processes. The invention is compatible with standard semiconductor processing techniques and provides increased capacitance per unit area for a wide variety of capacitor requirements. The invention exploits vertical dimensions, reduces the chip area required for capacitors, and facilitates the use of advanced materials, such as high-k dielectric materials.

27 Claims, 8 Drawing Sheets

U.S. PATENT DOCUMENTS

| | | | | |
|---|---|---|---|---|
| 6,774,423 B1 * | 8/2004 | Kubo | ............................ | 257/303 |
| 2002/0047154 A1 | 4/2002 | Sowlati et al. | ............... | 257/307 |
| 2002/0113292 A1 | 8/2002 | Appel | ......................... | 257/532 |
| 2002/0192919 A1 | 12/2002 | Bothra | ........................ | 438/381 |
| 2003/0040161 A1 | 2/2003 | Schrenk et al. | .............. | 438/393 |
| 2003/0183862 A1 * | 10/2003 | Jin et al. | ...................... | 257/301 |
| 2003/0213989 A1 * | 11/2003 | Delpech et al. | .............. | 257/301 |

OTHER PUBLICATIONS

Aoki et al., "Robust 130nm-Node Cu Dual Damascene Technology with Low-k Barrier SiCN," 2001 IEEE, pp. 4.2.1-4.2.4.

Samavati et al., "Fractal Capacitors," IEEE Journal of Solid-State Circuits, vol. 33, No. 12, Dec. 1998, pp. 2035-2041.

Kotecki et al., "(Ba, Sr) TiO dielectrics $^3$for future stacked-capacitor DRAM," IBM J. Res. Develop., vol. 42, No. 3, May 1999, p. 367-382.

Media for SolidStte Technology, "Interfacial reaction and thermal stability of Ta2O5/TiN for metal electrode capacitors," http://solidstate.articles.printthis.clickability.com/pt/cpt?action=cpt&expire=&urlID=8160, Nov. 4, 2003, pp. 1-7.

* cited by examiner

US 6,999,298 B2

MIM MULTILAYER CAPACITOR

TECHNICAL FIELD

The present invention relates generally to electronic circuits and circuit components. More particularly, it relates to capacitor structures.

BACKGROUND OF THE INVENTION

Metal-insulator-metal (MIM) capacitors are utilized in many circuit applications including DRAM cells for memory storage, microprocessors for decoupling capacitance, RF circuits for oscillators, phase-shift networks, and coupling and bypass, as well as mixed-signal devices for decoupling and high-frequency noise filters.

Capacitors have historically produced by depositing a layer of insulating material over a bottom metal plate and then depositing a top metal plate over the insulating material layer and parallel to the bottom metal plate. The capacitance of such structures is a function of several variables, such as the surface area of the two parallel plates, the spacing between the plates, and the dielectric constant of the insulating material used. As with other circuit components, there is a constant demand for more efficient capacitors. While the capacitance of a MIM capacitor can be increased by expanding the size or surface area of the metal plates, this also consumes more space. Thus, it is particularly desirable to increase the capacitance of a MIM capacitor per unit area of substrate used, such that a significantly increased capacitance can be achieved with little or no increase in surface area. Thus, there is a need for providing higher efficiency and/or performance MIM capacitor structures. It would also be desirable if such structures were compatible with standard semiconductor processing techniques.

BRIEF DESCRIPTION OF THE DRAWINGS

Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF PREFERRED EMBODIMENTS

The present invention provides novel Metal-Insulator-Metal (MIM) capacitors and methods for the production thereof. The methods of the present invention can be used to manufacture discrete capacitors or, alternatively, capacitor structures incorporated into integrated circuits. The capacitor structures disclosed herein are compatible with standard semiconductor processing techniques and are RF capable. Moreover, they facilitate the use of advanced materials not available for use with standard processing technology. In addition, the disclosed structures facilitate interconnects of the multiple layers contained therein without the need for complex patterning and contacts. Interconnects may instead be formed as a by-product of the electrode formation. Various embodiments of the structure and methodology of the invention are disclosed herein.

The methodology and structure of one embodiment will be discussed with reference to FIGS. 1–6. While the accompanying figures show the processing steps for manufacturing a capacitor structure in an integrated circuit (IC), it should be understood that a similar methodology may also be employed to manufacture a discrete capacitor version of this embodiment. FIGS. 1–5 show the processing steps for manufacturing the IC version of this embodiment, while FIG. 6 shows the discrete version of this embodiment in the same stage of processing as that of FIG. 5 for the IC version. Although the process steps are very similar, where applicable, differences in the process steps for a discrete capacitor as opposed to an IC version will be discussed. For example, it should be noted that the integrated version must contend with topology issues that are not present with respect to the discrete version. As such, the minimum feature size allowed in the IC version may be greater than that allowed in discrete versions.

Figure 1:
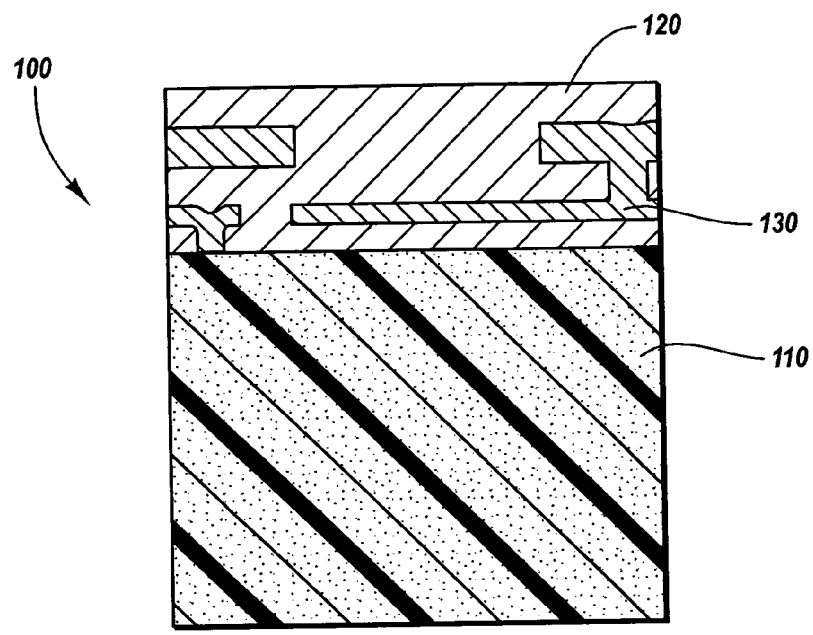
FIG. 1 is a cross-sectional view of the base structure from which integrated circuit versions of a capacitor structure can be manufactured.

FIG. 1 depicts a base structure that can be used to form a capacitor structure 100 for integrated circuit versions of the device. The structure comprises a substrate 110, an insulating material 120, and a conductive material 130. The process steps used to achieve the configuration depicted in FIG. 1 are standard and are well-known to those of ordinary skill in the art. For discrete versions of the device, the base structure would be similar, but the conductive material would not need to extend beyond a single layer and would not need to contact the substrate. As discussed later, the configuration depicted in FIG. 1 can be used to manufacture standard or nested embodiments of the IC capacitor structure.

Substrate 110 may include any suitable material available to those of skill in the art, including silicon, gallium arsenide, silicon germanium (SiGe), strained silicon, silicon-on-insulator (SOI), or silicon-on-sapphire (SOS).

Insulating material 120 may include any suitable material with insulating properties. Examples of such materials include plasma-enhanced chemical vapor deposited (PECVD) tetraethylorthosilicate (TEOS), boro-phosphosilicate glass (BPSG), chemical vapor deposited (CVD) silicon dioxide ($SiO_2$), and silicon nitride (SiN). This insulating material 120 will be used to contain the individual capacitor structures.

Conductive material 130 may include any of several different materials, including copper, aluminum (Al), an aluminum-silicon-copper alloy, titanium nitride (TiN), polysilicon, tungsten (W), or any other suitable metal or "metal-like" material. In addition, conductive material 130 may be made up of more than one layer of material. For instance, it could comprise a layer of aluminum or an aluminum-silicon-copper alloy on top of a bottom layer of titanium nitride (TiN). The conductive layer 130 may also be used as the interconnect layer to the bottom electrode 140, shown in later figures.

As will be discussed in greater detail later, embodiments of the present invention allow for use of capacitor dielectrics having a high dielectric constant (high-k). For purposes of this document, "high-k" dielectrics will be defined to include those materials having a dielectric constant greater than or equal to that of silicon dioxide, which is approximately 3.9. As discussed below, the structure and methodology of the invention allow for the use of materials with much higher dielectric constants.

Figure 2:
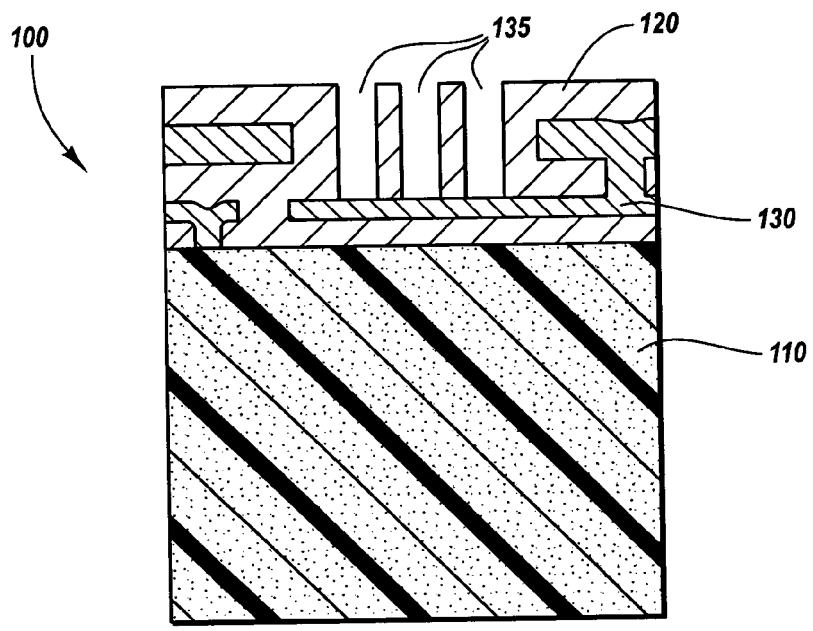
FIG. 2 is a cross-sectional view of the structure as depicted in FIG. 1 following formation of capacitor trenches.

Operating on the structure depicted in FIG. 1, the trenches in which the capacitors will be built are patterned and etched. Scribe lines may also be defined at this point. FIG. 2 depicts the structure after the capacitor trenches 135 have been formed. Trench formation is the only step requiring photolithography. The trenches 135 may be reasonably vertical and reach to the underlying conductive layer 130, as shown in FIG. 2. However, as discussed later, the trenches may be sloped to ameliorate conformality problems, some of which may be referred to as "pillowing," "shadowing," or "corner effects". It should be apparent that the number of trenches does not limit the scope of the invention. While three trenches are shown in FIG. 2, anything ranging from a single trench to any multiple thereof may be used in accordance with the principles of the disclosed invention. Moreover, the trenches need not be in the shape depicted in the accompanying figures. For instance, the trench sidewalls could be sloped such that the angle between the top of the trench and its sidewall is less than 90 degrees. Also, the trenches could be formed into entirely different shapes, such as shapes with rounded corners or no corners at all.

Figure 3:
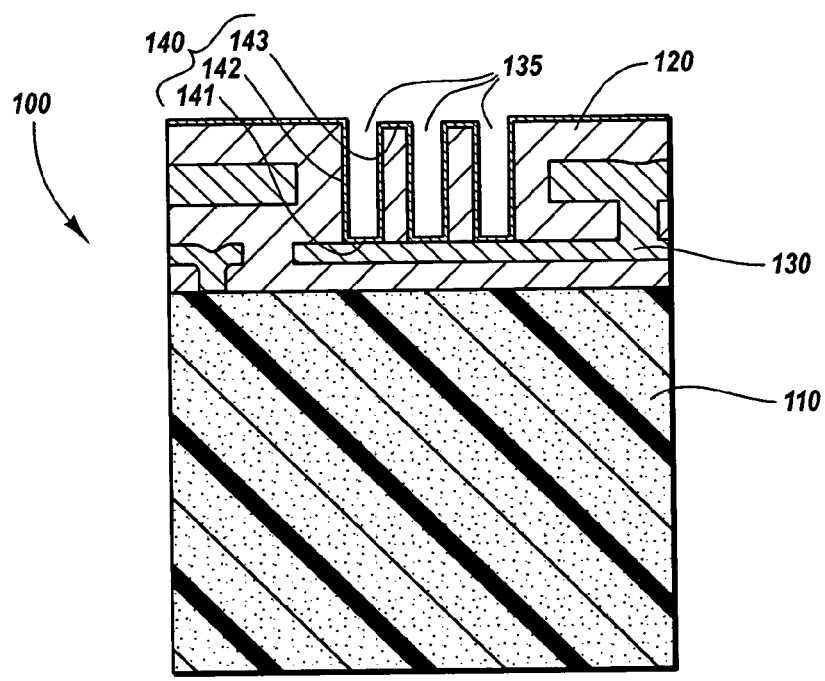
FIG. 3 is a cross-sectional view of the structure as depicted in FIG. 2 following deposition of a bottom electrode.

After the capacitor trenches 135 have been formed, the bottom electrode 140 is deposited using any one of a number of conformal deposition techniques including sputtering, evaporation, pulsed laser ablation, oxidation, chemical vapor deposition, electroplating, and other techniques commonly known in the art. As seen in FIG. 3, the bottom electrode 140 extends up the sides of the trenches in the form of bottom electrode sidewalls 142. Optionally, bottom electrode 140 may also extend over the top of the trenches in the form of bottom electrode top walls 143 and into the bottom of the trench or trenches in the form of bottom electrode base 141. If bottom electrode 140 does not have a base 141, then sidewalls 142 should extend to and contact conductive layer 130. The bottom electrode 140 may be comprised of any number of suitable materials. Examples include titanium nitride (TiN) film or a combination of titanium (Ti) with titanium nitride, tantalum nitride (TaN), tungsten (W), ruthenium (Ru), copper (Cu), or platinum (Pt). Typically, the film resulting in a lower resistivity will be selected. Other alternative films include PECVD TiN and spin-on films of either aluminum or tantalum.

While copper (Cu) is available for use as an electrode material (or as an interconnect material), it may be necessary to take additional steps when it is so used. To prevent performance degradation caused by copper atoms diffusing into the silicon, it may be desirable to develop a barrier layer, such as a tantalum (Ta) or titanium nitride (TiN) barrier layer to separate the copper.

The bottom electrode material can also be different than the material used to form the conductive layers. For instance, Ti or TiN could be used as the bottom electrode material, while either Cu or Al/Cu/Si could be used as the conductor 130 leading to the capacitor circuit. By limiting the use of Ti or TiN to the electrode structures only, overall circuit resistivity is reduced. The option to use different material for the bottom electrode 140 than is used for the conducting metal layers also allows for the use of more conformal materials, such as Tungsten, which would not be an option in conventional capacitor structures due to its low conductivity.

If, as shown in the accompanying figures, the bottom electrode sidewalls 142 are interconnected with the rest of the bottom electrode 140, etch requirements are relaxed relative to clearing the bottom of the trench. The etch stop for the process is the insulating material, which promotes process control and reduction of manufacturing variance.

Figure 4:
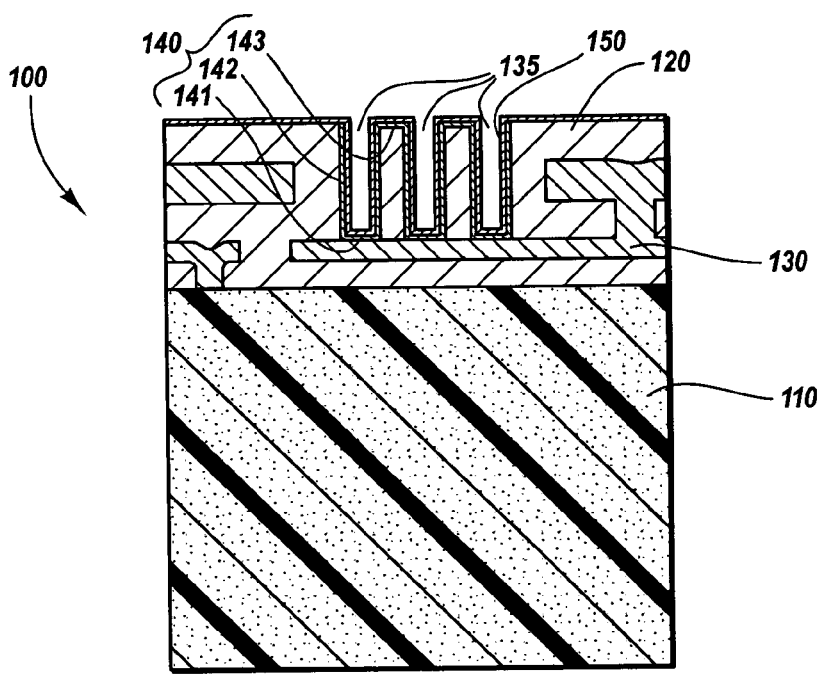
FIG. 4 is a cross-sectional view of the structure as depicted in FIG. 3 following deposition of a capacitor dielectric.

The bottom electrode 140 and associated interconnects are then patterned and etched to prepare for formation of the capacitor dielectric, which is shown after deposition in the trenches 135 in FIG. 4 at 150. While the patterning and etching of the bottom electrode is a process step that should be included in the IC version, in the discrete version the bottom electrode need not be patterned and etched at this point. Elimination of this process step increases the overall capacitance of the structure significantly. This increase in capacitance results from gaining capacitance on the top, sides, and bottom of the trench structure.

For the IC version, the etch process may be masked or unmasked, although masking the etch will optimize capacitance per unit area. The capacitor dielectric 150 is deposited over the entire wafer surface and should be conformal to the trenches 135, as shown in FIG. 4. The capacitor dielectric 150 can comprise any number of suitable materials, including high-k dielectric materials that cannot be used in conventional capacitor structures. Illustrative examples of such materials include silicon dioxide ($SiO_2$), silicon nitride ($Si_3N_4$), aluminum oxide ($Al_2O_3$), hafnium silicates (HfSiON), tantalum oxide ($Ta_2O_5$), zirconium oxide ($ZrO_2$), halfnium oxide ($HfO_2$), titanium oxide ($TiO_2$), and barium strontium titanate (BST), barium strontium titanium oxide (BSTO), and combinations of the foregoing. An example of a suitable combination of materials is a film of silicon nitride sandwiched between two layers of silicon dioxide. Depending on the ratio of oxide to nitride thickness, such films will yield a greater capacitance than the oxide alone, and would also approximate the lower gate leakage characteristics of a capacitor using only the oxide as its dielectric. The oxidenitride-oxide (ONO) film discussed above will have a dielectric constant around 6.0.

Films such as tantalum oxide ($Ta_2O_5$) thin films may be deposited by using chemical vapor deposition (CVD). Such processes are good candidates for use in certain embodiments of the present invention due to their low process temperature and excellent conformal step coverage. Tantalum oxide ($Ta_2O_5$) may be particularly desirable for capacitors that include electrode materials such as tungsten (W), titanium nitride (TiN), tantalum nitride (TaN), ruthenium (Ru), or platinum (Pt)

Deposition of capacitor dielectric films may alternatively be accomplished by using a two-step approach. Such an approach may involve a first, typically thinner, layer of film being deposited at a relatively low pressure. Thereafter, a second layer is deposited at a significantly higher pressure to achieve a superior deposition rate.

Figure 5:
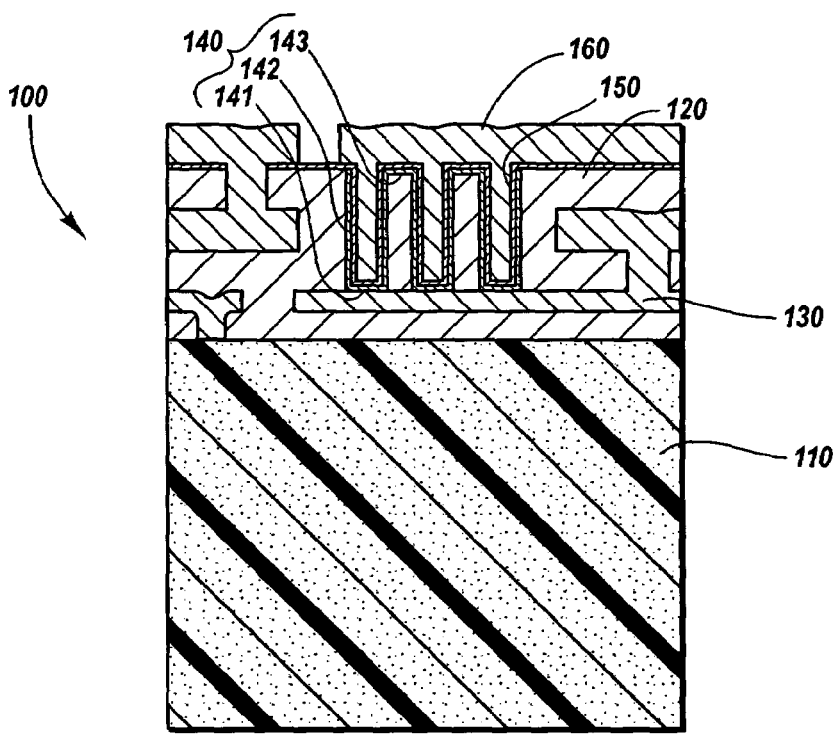
FIG. 5 is a cross-sectional view of the structure as depicted in FIG. 4 following deposition of a top electrode.
Figure 6:
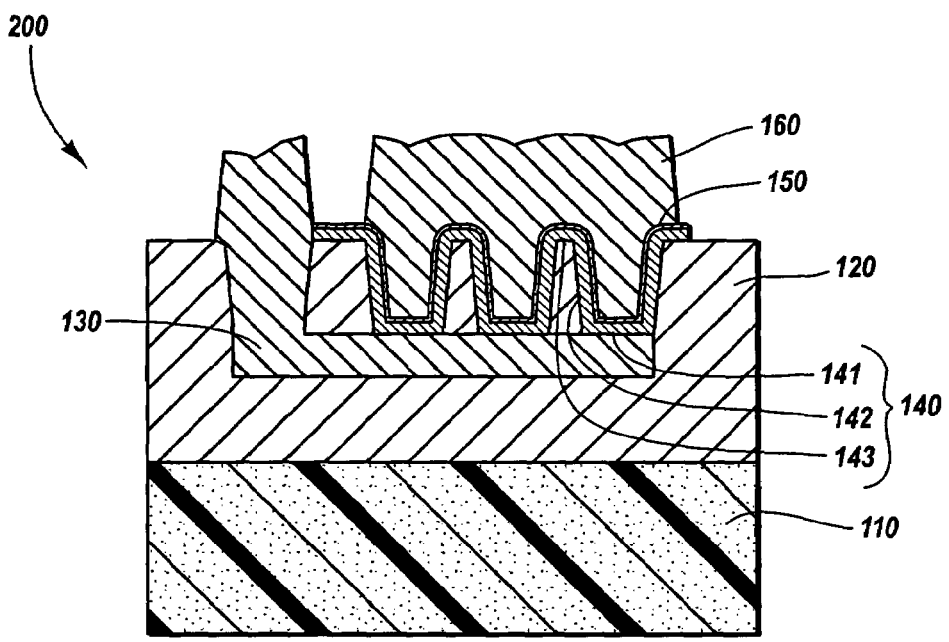
FIG. 6 is a cross-sectional view of a discrete capacitor version of the embodiment shown in FIG. 5.

Once the dielectric 150 has been deposited, the top electrode layer 160 is deposited, as shown in FIG. 5. With appropriate patterning, top electrode layer 160 may act as both the conductor leading to the top and bottom electrodes as well as the top electrode itself. It is also possible, however, to use different materials for the top electrode and its associated conductor, similar to the configuration of the bottom electrode. Top electrode layer 160 will simply fill the trench after the dielectric 150 has been deposited. As such, its conformality is not as important as the bottom electrode. However, the film of the top electrode layer 160 should be either highly viscous or be of small enough grain size so as to fill the high aspect ratio of the capacitor trenches. Various conductive materials as disclosed herein for use in forming the bottom electrode may also be used to form the top electrode and/or conductor connecting the top and bottom electrodes.

Like the discrete version, the process for the integrated version then involves deposition of a protective topside layer. This layer may be comprised of, for example, an oxide-nitride sandwich. Once deposited, the topside layer is typically patterned and etched so as to open bond pads.

As mentioned, this structure can be used in integrated circuits or, alternatively, can be a discrete capacitor structure. The process steps for the discrete version as compared to the IC version are similar, and have been described where they differ. Following completion of the basic process steps illustrated in FIGS. 1–5, the discrete version will resemble the structure 200 depicted in FIG. 6. As can be seen, the structure is very similar to the IC version. However, in the discrete version, the conductive material 130 does not extend into a middle layer to serve as an interconnect between adjacent circuit components and also does not extend to and contact the substrate 110.

For integrated circuit applications like CMOS, the structure may need to be developed late in the flow after the source and drains have been formed. If so developed, high temperature thermal-grown dielectrics will not be available for use. Instead, low temperature CVD or plasma-enhanced CVD (PECVD) films should be used. However, because this means the dielectric will not be exposed to the high temperatures associated with source/drain activation or to dopants found early in the process flow, it also facilitates the use of high-k dielectrics.

Figure 15:
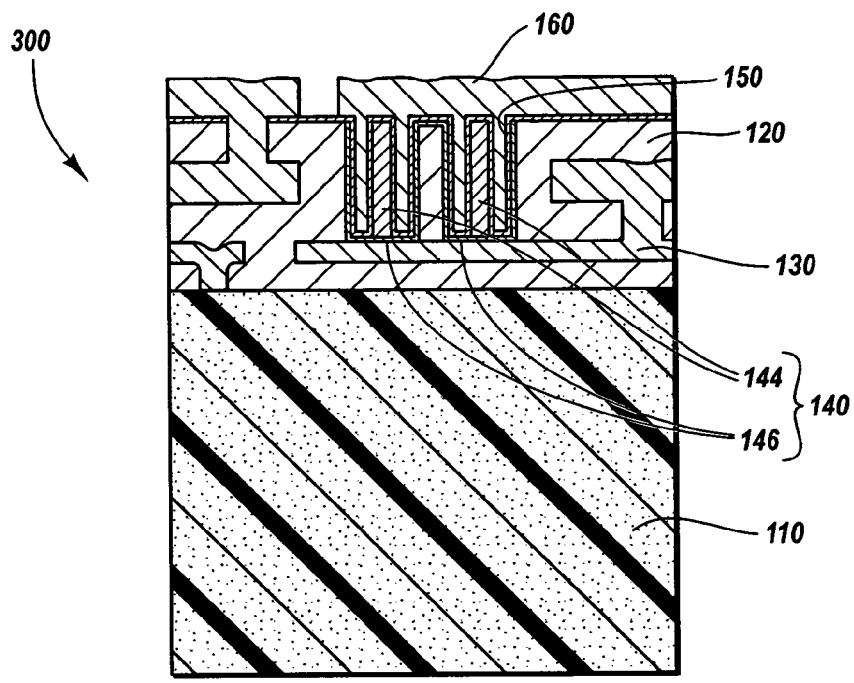
FIG. 15 is a cross-sectional view of the structure as depicted in FIG. 14 following deposition of a top electrode.
Figure 16:
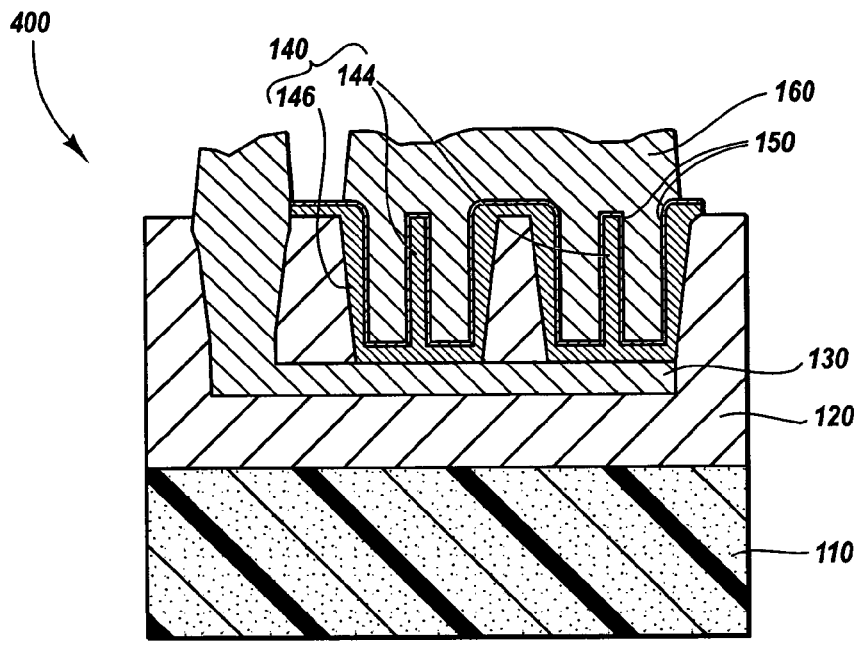
FIG. 16 is a cross-sectional view of a discrete capacitor version of the embodiment shown in FIG. 15.

Another embodiment of the invention will now be described in detail. These embodiments will be referred to as "nested" embodiments. Such embodiments, like the previous embodiments, can be used for discrete capacitors or can be incorporated into integrated circuitry. The structure of one such embodiment is shown in FIGS. 7–15 at 300 and a discrete version of this embodiment is shown in FIG. 16 at 400. Nested embodiments generally provide a greater capacitance per unit area than non-nested embodiments with the same level of photolithography technology. Moreover, they provide a greater capacitance per unit area without any additional surface area consumption.

Because the nested process applies to produce discrete or integrated capacitors, this process will again be described and depicted in the accompanying figures solely in connection with the integrated version. Thus, the starting point or process opening will be the same as is shown in FIG. 1 with respect to a non-nested integrated structure.

Figure 7:
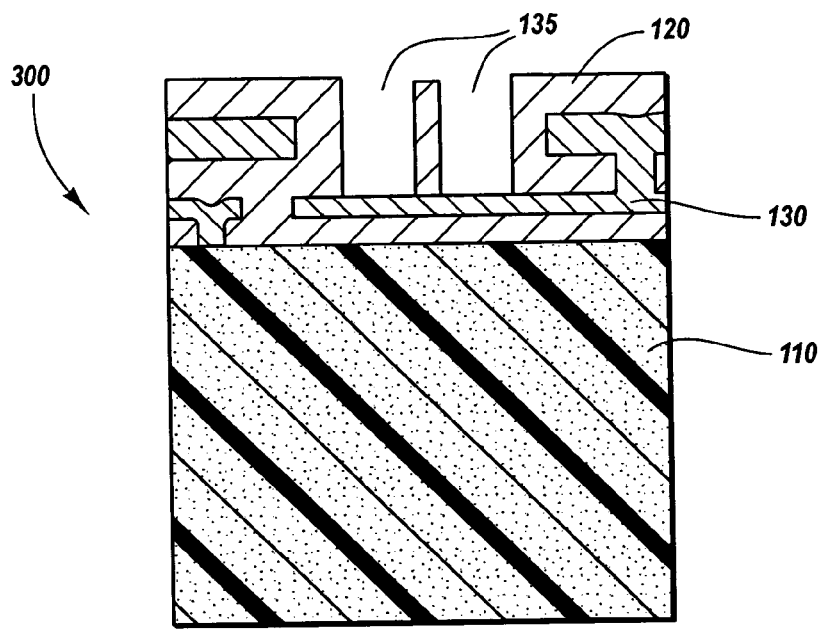
FIG. 7 is a cross-sectional view of the structure as depicted in FIG. 1 following formation of capacitor trenches.

Starting with the structure depicted in FIG. 1, the capacitor trenches 135 are cut into the insulating material, as shown in FIG. 7. As shown, the trenches in the nested version will be slightly wider than those of the standard version, but the pitch (the distance from the edge of one trench to the same edge of the succeeding trench) may be substantially the same. Again, the number of trenches is not important—a single trench or any number of trenches will suffice. Moreover, the shape of the trench may vary considerably, as discussed later. Because the trench inner dimensions are larger, the photolithography requirements are relaxed in comparison to non-nested embodiments of the device.

Figure 8:
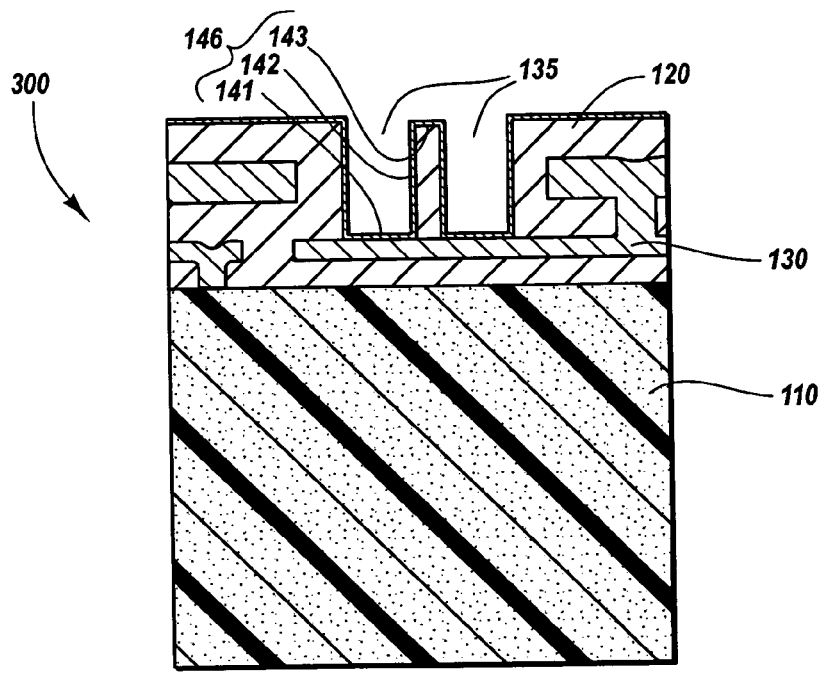
FIG. 8 is a cross-sectional view of the structure as depicted in FIG. 7 following deposition of a bottom electrode layer.

As shown in FIG. 8, after the trenches 135 have been formed, part of the bottom electrode 140 will then be formed by depositing the appropriate materials in the trenches 135. When the entire bottom electrode 140 has been deposited, as shown in FIGS. 11–16, bottom electrode 140 in nested embodiments will generally include one or more bottom electrode sidewalls 142, one or more bottom electrode top walls 143, and a bottom electrode base 141—together comprising bottom electrode layer 146—and one or more bottom electrode plugs 144. Both the sidewalls 142 and plugs 144 are connected to the base 141 of the bottom electrode. However, the bottom electrode 140 need not have a base 141 and need not have a top wall 143 either. Instead, the bottom electrode sidewalls 142 may connect directly with the conductive material 130. In other words, the conductive material 130 could serve as the bottom electrode "base." Thus, a "bottom electrode layer" could comprise a layer of suitable material along just the sidewalls 142 of a capacitor trench 135.

The processing and materials for forming this portion of the bottom electrode are similar to those for non-nested embodiments. Specifically, the bottom electrode layer 146 (and the rest of bottom electrode 140, as discussed later) can be made of a TiN film, a Ti/TiN sandwich, or any of the other materials disclosed for use as the bottom electrode 140 in non-nested embodiments. The aspect ratio, however, is more relaxed in nested embodiments because of the greater trench width. On the other hand, conformality will be more important in nested embodiments, due to the fact that as processing continues the final aspect ratio will become successively greater.

Attention should also be paid to conformality effects at the top of the trench. Such effects are a common result of the deposition of films over steps. During the deposition an overhang (pillow) may form at the 90 degree steps down into the trench. The formation of this overhang is very dependent upon the deposition technique and specific process conditions. For example, during a sputter deposition, which is highly directional in nature, the step (outside corner) acts to partially shadow the trench region from the incoming material ions. The film begins to build up on the corner regions forming an overhang (somewhat akin to a snow cornice at the top of a mountain ridge). This overhang can affect the uniformity of the film deposited on the trench sidewall.

The formation of the overhang is highly dependent on the deposition process technique and specific conditions (temperature, rate of deposition, aspect ratio of the trench, wall angle). Sputter deposited films are very prone to the problem. CVD or PECVD techniques tend to be more conformal. Other factors such as the material being deposited and the actual material transfer mechanism are also important. Thus, these effects should be avoided or minimized if possible.

There are measures that can be taken to avoid or minimize such problems. In general, increasing the temperature (and thus the energy and surface mobility of the incoming species) and slowing down the sputter rate help reduce these non-conformance effects for sputter-deposited films. Another way to reduce these effects is to reduce the sidewall angle relative to the horizontal (i.e., make them sloped; less than 90 degrees). This can be accomplished by controlling the trench etch parameters. This technique would reduce the severity of the problem with sputter-deposited films. It would also help to improve film uniformity (especially on the sidewall) with other deposition techniques. Other deposition processes, such as CVD and PECVD, are also better suited than sputter deposition to avoid the problem. However, any of the disclosed or otherwise available deposition methods can be used and should be considered within the scope of the invention.

In integrated versions of nested embodiments, the bottom electrode layer 146 is then typically patterned and etched. However, with respect to discrete nested embodiments, the bottom electrode layer 146 need not be patterned or etched at all. The elimination of this process step in such embodiments provides an overall increase in capacitance.

Figure 9:
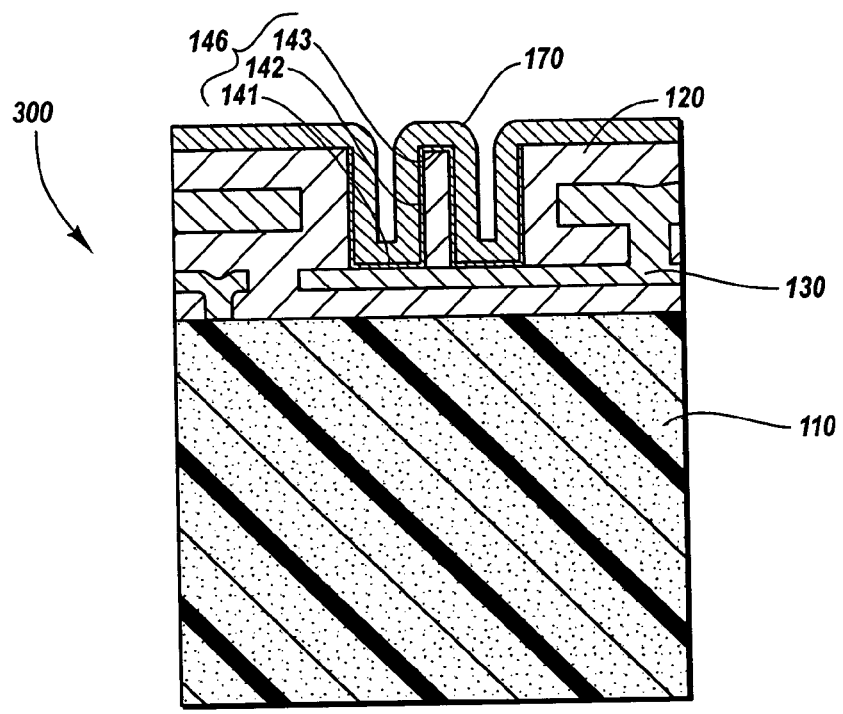
FIG. 9 is a cross-sectional view of the structure as depicted in FIG. 8 following deposition of a sacrificial material.

With reference now to FIG. 9, at this point a sacrificial material 170 is deposited. The sacrificial material will be used to create a "mold within a mold" to establish further aspects of the capacitor structure. FIG. 9 depicts this stage of the process (after deposition of the sacrificial material). The material used for the sacrificial layer may be selected from any of a number of materials that are highly conformal and that have suitable etch and pattern characteristics. Examples of suitable materials include silicon nitride ($Si_3N_4$) and tetraethylorthosilicate (TEOS). Typically, the sacrificial material 170 is a film deposited using a PECVD process. The thickness of the film should be defined to some degree by the thickness of the top electrode because after removal of the sacrificial layer this is where the top electrode is formed.

It should be understood that while the sacrificial material 170 is shown in FIG. 9 as having been deposited as a layer, variations are possible. For example, the sacrificial material 170 may be deposited in discontinuous layers such that the bottom and/or top of each trench is clear. It should also be understood that the shape of the nested structure depicted in the accompanying figures does not limit the scope of the invention. Any imaginable shape can be used. For instance, the trench/mold shape could be spherical, box-like, annular, etc. Any surface shape will benefit from the increased capacitance per unit surface area provided by the added vertical area of the disclosed architectures.

Figure 10:
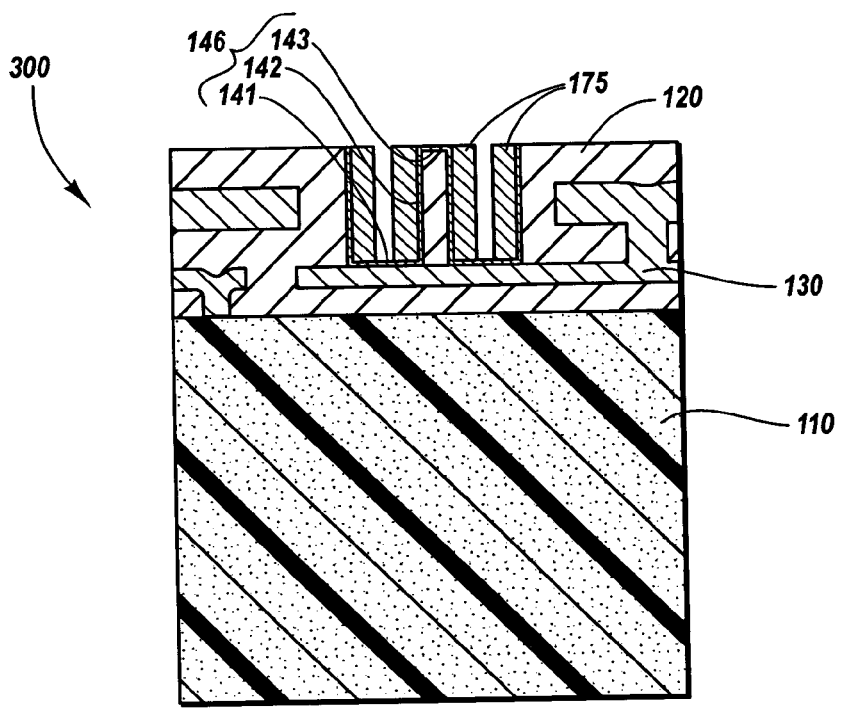
FIG. 10 is a cross-sectional view of the structure as depicted in FIG. 9 following an etch of a sacrificial material leaving only sacrificial sidewalls.

Referring now to FIG. 10, once the sacrificial material 170 has been deposited, the sacrificial material 170 is then etched from above the insulating material 120 and from the bottom of the trenches, leaving the structure to appear as in FIG. 10. Because the bottom of the trenches should be cleared of the sacrificial material, the etching is typically done with a highly directional plasma etch with the wafers unmasked. It may, however, be necessary in certain circumstances to mask the wafer prior to etch. Again, it may alternatively be possible to deposit the sacrificial material 170 in the configuration shown in FIG. 10 directly instead of etching away the unwanted portions. Completion of this step leaves the sacrificial material in the form of sacrificial sidewalls 175, as shown in FIG. 10.

Figure 11:
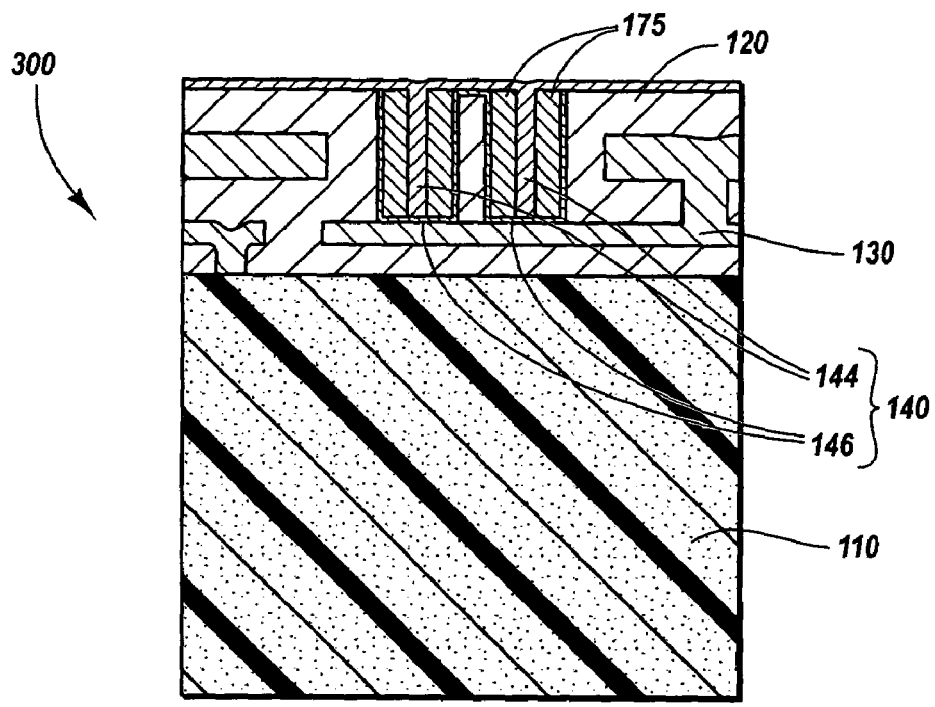
FIG. 11 is a cross-sectional view of the structure as depicted in FIG. 10 following deposition of bottom electrode plugs.

As shown in FIG. 11, after the sacrificial material 170 has been deposited and etched to form sacrificial sidewalls 175, the plug or plugs 144 of the bottom electrode are deposited. Creation of the bottom electrode plug or plugs 144 is accomplished with a process and materials similar to that defined in the formation of the remainder of the bottom electrode 140, as discussed above.

Figure 12:
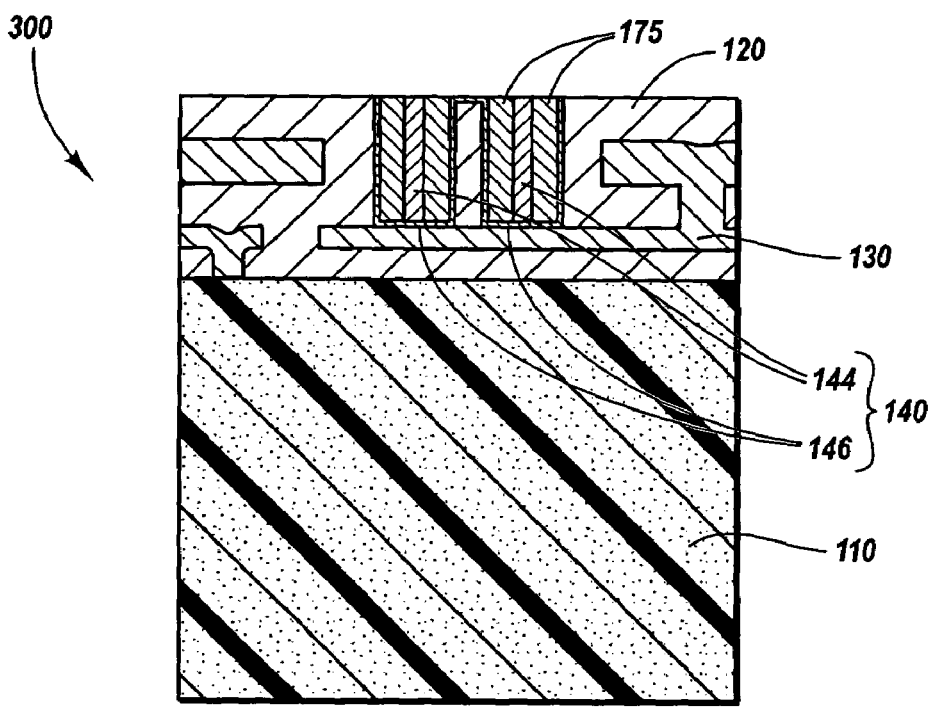
FIG. 12 is a cross-sectional view of the structure as depicted in FIG. 11 following an etch of a bottom electrode plug material.

With reference to FIG. 12, the bottom electrode plugs 144 are formed by filling the empty portion of the trenches 135 with a suitable conductive material, preferably being a highly conformal material with excellent fill characteristics. If the conductive material has been applied across the entire surface of the wafer, the completion of the bottom electrode plug formation is accomplished with an etchback or Chemical-Mechanical Polishing (CMP) of the metal that is on top of the insulating layer 120 and the metal encapsulating the sacrificial layer. This leaves only the bottom electrode plugs 144 inside the trenches 135, as shown in FIG. 12.

Figure 13:
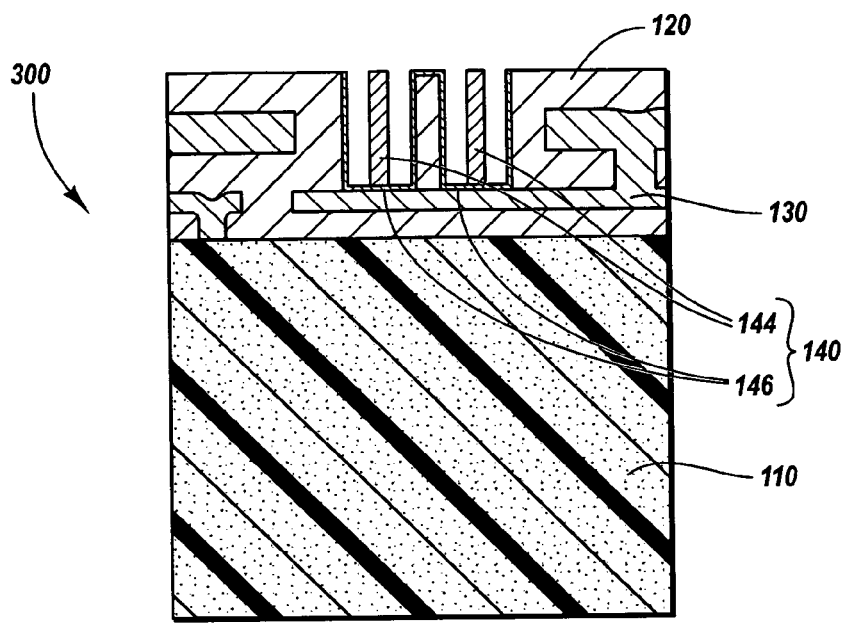
FIG. 13 is a cross-sectional view of the structure as depicted in FIG. 12 following removal of the remaining sacrificial material.

Referring to FIG. 13, the remainder of the sacrificial material 170 is then removed with an etch process. This etch should be selective to both the conductive materials used for the bottom electrode 140 and the insulating layer 120. Alternatively, an etchstop layer over the insulating layer 120 may be used. This etch process may be accomplished by any suitable methodology available to those of skill in the art. Once the remainder of the sacrificial material 170 has been removed, the structure will appear as shown in FIG. 13.

Figure 14:
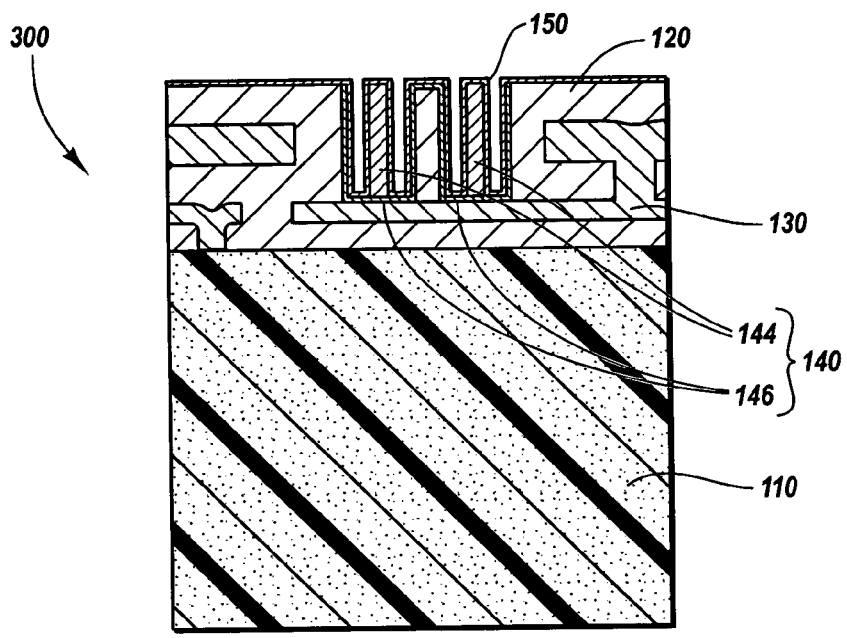
FIG. 14 is a cross-sectional view of the structure as depicted in FIG. 13 following deposition of a capacitor dielectric.

As shown in FIG. 14, at this point a capacitor dielectric film 150 is deposited using essentially the same process and any of the same materials disclosed for non-nested embodiments. The aspect ratios, however, are more aggressive. The capacitor dielectric 150 is typically applied over the entire bottom electrode 140, including bottom electrode layer 146 and bottom electrode plug(s) 144. FIG. 14 shows the structure after the capacitor dielectric 150 has been deposited.

Following this step, the dielectric 150 is masked and etched. This patterning will allow the top electrode to interconnect with the conductive layer 130 and the associated bottom electrode 140 structures. This mask step will also open the scribe lines.

The remainder of the processing is essentially the same as with non-nested embodiments of the device. The top electrode material 160 is deposited, as depicted in FIG. 15. However, because the trenches are now much narrower than they are in non-nested embodiments, the "fill" characteristics are more important. Lastly, the topside layer (not shown) is deposited and patterned (in integrated versions) so as to open bond pads.

As mentioned, nested structures may also be used as discrete MIM capacitors. FIG. 16 shows a discrete, nested embodiment in the same stage of processing as shown in FIG. 15 for an IC version.

Alternative processes for nested embodiments of the device are also available. Some of such processes replace the need for a sacrificial layer and its associated processing with a Chemical-Mechanical Polish (CMP) and a mask step. Such processes may involve depositing a layer of aluminum alloy or other suitable conductive material immediately after the capacitor trenches have been formed. This layer will become a vertical extension of the bottom electrode in the form of a bottom electrode plug. This layer is then chemical-mechanical polished to planarize the layer with the top of the trenches. Thereafter, the layer is patterned and etched, leaving a plug of the material in the center of each of the trenches. The bottom electrode is then formed using the same technique as with the standard version process.

For integrated versions such processes, the bottom electrode is then patterned and etched and is identical to that used in non-nested embodiments. However, for some embodiments of an alternative process flow, the bottom electrode need not be patterned and etched at all. By eliminating this process step, the overall capacitance of the structure is maximized since the entire surface of each individual chip will become one large capacitor.

At this point, the capacitor dielectric film is deposited, which includes any of the same materials discussed with respect to the capacitor dielectric film of the non-nested embodiment discussed previously.

The dielectric is then masked and etched. This patterning allows the top electrode to interconnect with the conductive material layer and the associated bottom electrode structures. Additionally, this mask step will open the scribe lines.

The balance of the processing steps necessary to build nested embodiments are essentially the same as with non-nested embodiments. The top electrode is deposited, after which, as with the non-nested embodiments, a protective topside layer is deposited. Once deposited, it will then be necessary to pattern the topside layer so as to open bond pads in integrated versions and solder pads in discrete versions.

It will be obvious to those having skill in the art that many changes may be made to the details of the above-described embodiments of this invention without departing from the underlying principles thereof. The scope of the present invention should, therefore, be determined only by the following claims.

The invention claimed is:

1. A capacitor structure, comprising:
a substrate;
an insulating material formed on the substrate, wherein the insulating material serves as a form for defining a capacitor trench;
a bottom electrode, wherein the bottom electrode comprises a bottom electrode layer in the capacitor trench and first and second bottom electrode plugs disposed within the capacitor trench, wherein the bottom electrode layer extends up the sides of the capacitor trench to form bottom electrode sidewalls;
a capacitor dielectric at least partially positioned on the bottom electrode and in direct contact with the first and second bottom electrode plugs and formed around a majority of the bottom electrode plug; and
a top electrode at least partially positioned on the capacitor dielectric and formed around a majority of the bottom electrode plug.

2. The capacitor structure of claim 1, wherein the capacitor dielectric is made from a material having a higher dielectric constant than the dielectric constant of the insulating material.

3. The capacitor structure of claim 1, wherein the capacitor dielectric has a high-k dielectric constant.

4. The capacitor structure of claim 1, wherein the capacitor dielectric has a dielectric constant greater than on equal to about 6.0.

5. The capacitor structure of claim 1, wherein the capacitor dielectric comprises a stack comprising more than one material.

6. The capacitor structure of claim 1, wherein the capacitor structure is a discrete capacitor.

7. The capacitor structure of claim 1, wherein the capacitor structure is configured to be part of an integrated circuit.

8. The capacitor structure of claim 1, further comprising a conductive material layer, wherein the conductive material layer is in contact with the bottom electrode.

9. The capacitor structure of claim 8, wherein the conductive material layer is a different material than the bottom electrode.

10. The capacitor structure of claim 1, wherein the bottom electrode and the capacitor dielectric are formed in the shape of a box.

11. The capacitor structure of claim 1, wherein the top electrode is at least partially disposed in the capacitor trench such that the top electrode interdigitates with the bottom electrode.

12. The capacitor structure of claim 1, wherein the bottom electrode layer further comprises a bottom electrode top wall.

13. The capacitor structure of claim 12, wherein the bottom electrode layer further comprises a bottom electrode base.

14. A capacitor structure, comprising:
a substrate;
a metal layer formed above the substrate;
an insulating material at least partially formed on the metal layer, wherein the insulating material serves as an outside sidewall for defining a capacitor trench above the metal layer;
a bottom electrode, comprising a bottom electrode layer in the capacitor trench and first and second bottom electrode plugs disposed within the capacitor trench, wherein the bottom electrode layer directly contacts the metal layer and extends up the sides of the capacitor trench to form bottom electrode sidewalls;
a capacitor dielectric at least partially positioned on the bottom electrode and in direct contact with the bottom electrode layer and the first and second bottom electrode plugs; and
a top electrode at least partially positioned on the capacitor dielectric.

15. The capacitor structure of claim 14, wherein the first and second bottom electrode plugs are disposed between the bottom electrode layer and the capacitor dielectric such that the bottom electrode plugs are in direct contact with the metal layer.

16. The capacitor structure of claim 14, wherein the first and second bottom electrode plugs are completely disposed within the capacitor trench and extend approximately the same length as the outside sidewall.

17. The capacitor structure of claim 14, wherein the first and second bottom electrode plugs include metal.

18. The capacitor structure of claim 14, wherein the capacitor dielectric and the top electrode extend around a majority of the first and second bottom electrode plugs.

19. The capacitor structure of claim 14, further comprising an insulating plug formed on the metal layer and defining inside sidewalls for the capacitor trench, wherein the bottom electrode layer, the capacitor dielectric, and the top electrode at least partially extend around the insulating plug.

20. The capacitor structure of claim 14, wherein the capacitor dielectric has a dielectric constant greater than or equal to about 6.0.

21. The capacitor structure of claim 14, wherein the capacitor dielectric comprises a stack comprising more than one material.

22. The capacitor structure of claim 14, wherein the capacitor dielectric is made from a material having a higher dielectric constant than the dielectric constant of the insulating material.

23. The capacitor structure of claim 14, wherein the capacitor dielectric has a high-k dielectric constant.

24. The capacitor structure of claim 14, wherein the capacitor structure is a discrete capacitor.

25. The capacitor structure of claim 14, wherein the capacitor structure is configured to be part of an integrated circuit.

26. The capacitor structure of claim 14, wherein the metal layer is comprised of a different material than the bottom electrode.

27. The capacitor structure of claim 14, wherein the top electrode is at least partially disposed in the capacitor trenches such that the top electrode interdigitates with the bottom electrode.

* * * * *